(12) United States Patent
Misic

(10) Patent No.: US 6,356,081 B1
(45) Date of Patent: Mar. 12, 2002

(54) MULTIMODE OPERATION OF QUADRATURE PHASED ARRAY MR COIL SYSTEMS

(75) Inventor: George J. Misic, Allison Park, PA (US)

(73) Assignee: Medrad, Inc., Indianola, PA (US)

( * ) Notice: Subject to any disclaimer, the term of this patent is extended or adjusted under 35 U.S.C. 154(b) by 0 days.

(21) Appl. No.: 09/449,255

(22) Filed: Nov. 24, 1999

Related U.S. Application Data

(60) Provisional application No. 60/109,820, filed on Nov. 25, 1998.

(51) Int. Cl.$^7$ .................................................. G01V 3/00
(52) U.S. Cl. ........................................ 324/318; 600/422
(58) Field of Search ................................ 324/318, 322, 324/300, 306, 307, 309, 314; 600/421, 422

(56) References Cited

U.S. PATENT DOCUMENTS

| | | | |
|---|---|---|---|
| 4,634,980 A | 1/1987 | Misic et al. | |
| 4,684,895 A | 8/1987 | Misic | |
| 4,692,705 A | 9/1987 | Hayes | |
| 4,731,584 A | 3/1988 | Misic et al. | |
| 4,740,751 A | 4/1988 | Misic et al. | |
| 4,764,726 A | 8/1988 | Misic et al. | |
| 4,793,356 A | 12/1988 | Misic et al. | |
| 4,797,617 A | 1/1989 | Misic et al. | |
| 4,825,162 A | 4/1989 | Roemer et al. | |
| 4,839,594 A | 6/1989 | Misic et al. | |
| 4,841,248 A | 6/1989 | Mehdizadeh | |
| 4,879,516 A | 11/1989 | Mehdizadeh et al. | |
| 4,881,034 A * | 11/1989 | Kaufman et al. | ........... 324/318 |
| 4,920,318 A | 4/1990 | Misic et al. | |
| 4,975,644 A * | 12/1990 | Fox | .............................. 324/318 |
| 5,136,244 A | 8/1992 | Jones et al. | |
| 5,196,796 A | 3/1993 | Misic et al. | |
| 5,209,233 A | 5/1993 | Holland et al. | |
| 5,256,971 A | 10/1993 | Boskamp | |
| 5,258,717 A | 11/1993 | Misic et al. | |
| 5,315,251 A | 5/1994 | Derby | |
| 5,348,010 A | 9/1994 | Schnall et al. | |
| 5,355,087 A | 10/1994 | Claiborne et al. | |
| 5,517,120 A | 5/1996 | Misic et al. | |
| 5,521,506 A | 5/1996 | Misic et al. | |
| 5,602,479 A | 2/1997 | Srinivasan et al. | |
| 5,610,520 A | 3/1997 | Misic | |
| 5,998,999 A | 12/1999 | Richard et al. | |
| 6,040,697 A | 3/2000 | Misic | |
| 6,051,974 A | 4/2000 | Reisker et al. | |
| 6,100,691 A | 8/2000 | Yeung | |
| 6,177,797 B1 * | 1/2001 | Srinivasan | .................. 324/318 |
| 6,177,979 B1 | 1/2001 | Srinivasan | |
| 6,223,065 B1 | 4/2001 | Misic et al. | |

OTHER PUBLICATIONS

Lin et al., (1998), *Magnetic Resonance in Medicine*, "A Novel Multi–segment Surface Coil for Neuro–Functional Magnetic Resonance Imaging," vol. 39, pp. 164–168.

Meyer et al, (1995), *Journal of Magnetic Resonance, Series B*, "A 3X3 Mesh Two–Dimensional Lader Network Resonator of MRI of the Human Head," vol. 107, pp. 19–24.

Roemer, et al., (1990), *Magnetic Resonance in Medicine*, "The NMR Phase Array," vol. 16, pp, 192–225.

* cited by examiner

*Primary Examiner*—Louis Arana
(74) *Attorney, Agent, or Firm*—Matthew J. Sampson; Gregory L. Bradley

(57) ABSTRACT

A coil interface for coupling a phased array magnetic resonance imaging coil to a magnetic resonance imaging system. The coil interface includes a plurality of signal inputs and a plurality of output ports. Each of the output ports is associated with a receiver in the magnetic resonance imaging system. The coil interface also includes an interface circuit. The interface circuit selectively couples at least two of the signal inputs to at least one of the plurality of input ports. Where the coil is a quadrature phased array coil, a preferred embodiment allows the two quadrature signals to be acquired as a single signal, precombined at the RF level within the coil interface, or as two separate RF signals by two of the receivers of the magnetic resonance imaging system hardware.

19 Claims, 6 Drawing Sheets

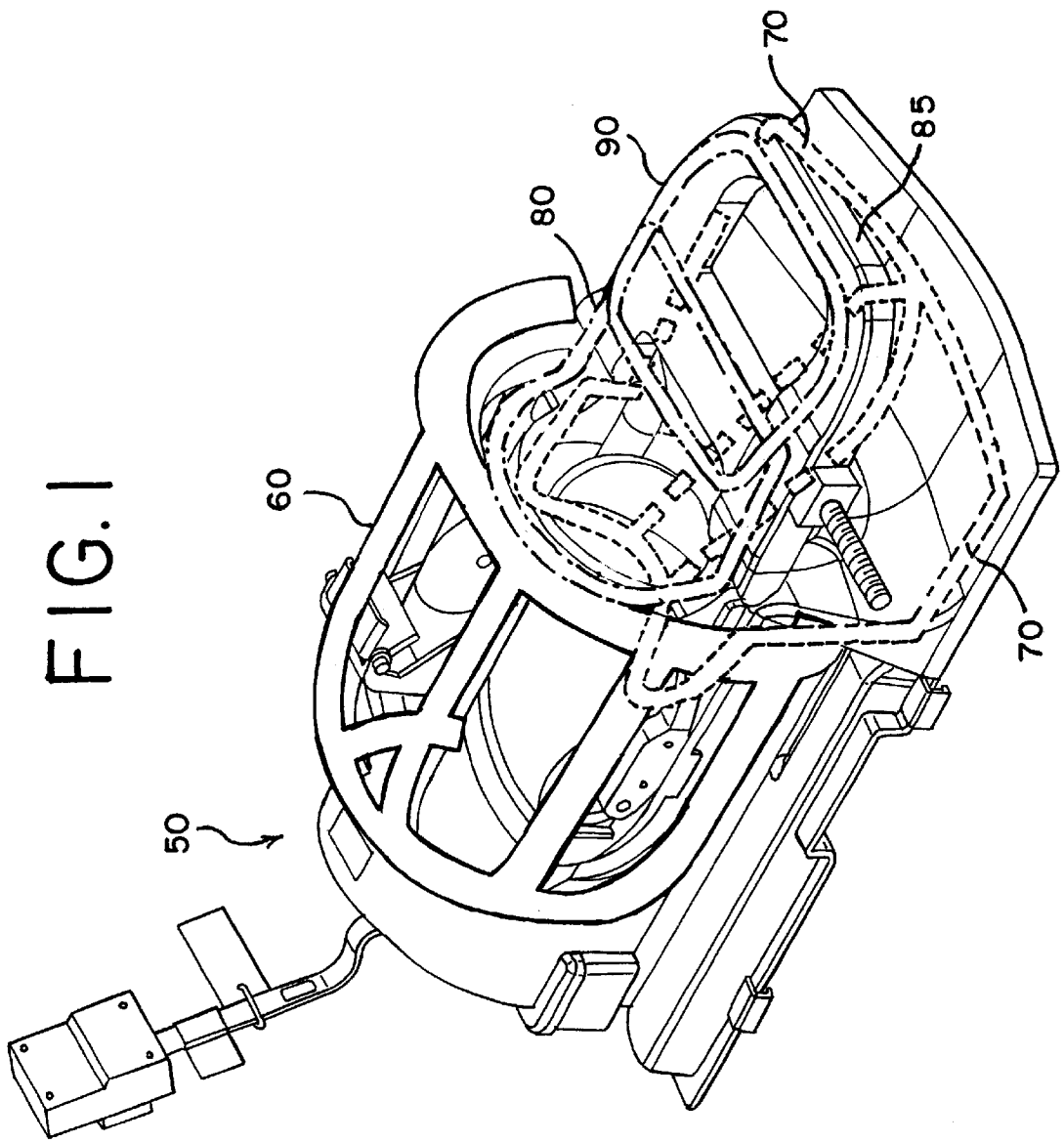

I. NVPA (NEUROVASCULAR)

- QUADRATURE / PHASED ARRAY MODE
- CONFIGURATION FILE WILL TURN ON ENTIRE ARRAY
- MAY BE USED FOR ALL TYPE OF BRAIN AND NECK IMAGING, EXCLUDING ECHO PLANAR IMAGING (EPI)
- FOV 46CM (MAXIMUM)

RECOMMENDED USES:
- BRAIN AND OR CERVICAL SPINE LOCALIZERS
- IMAGING OF THE CERVICAL SPINE
- IMAGING OF THE CAROTID ARTERIES
- IMAGING OF THE AORTIC ARCH

2. FASTBRN (FAST BRAIN)

- QUADRATURE MODE
- CONFIGURATION FILE WILL TURN ON ONLY THE HEAD COIL SECTION OF THE ARRAY
- MAY BE USED FOR ECHO PLANAR IMAGING (EPI)
- MAY BE USED FOR VASCULAR STUDIES OF THE BRAIN TO REDUCE RECON TIME
- FOV 24 CM

RECOMMENDED USES:
- EPI SEQUENCES
- IMAGING OF THE BRAIN
- IMAGING OF CIRCLE OF WILLIS

3. HRBRN (HIGH RESOLUTION BRAIN ARRAY)

- QUADRATURE/PHASED ARRAY MODE
- CONFIGURATION FILE WILL TURN ON ONLY THE HEAD COIL SECTION OF THE ARRAY
- USE CONFIGURATION WHEN IMAGING THE BRAIN FOR HIGH RESOLUTION
- COMPATIBLE WITH ALL IMAGING SEQUENCES, EXCEPT EPI
- FOV 24 CM

RECOMMENDED USES:
- HIGH RESOLUTION BRAIN IMAGING
- HIGH RESOLUTION CIRCLE OF WILLIS IMAGING

MULTIMODE OPERATION OF QUADRATURE PHASED ARRAY MR COIL SYSTEMS

CROSS-REFERENCE TO RELATED APPLICATION

This application claims the benefit of U.S. Provisional Application No. 60/109,820, filed Nov. 25, 1998.

BACKGROUND OF THE INVENTION

The advantages of using phased array or multi-coil MR coil systems to enhance magnetic resonance imaging and spectroscopy are well known. A situation facing the designer of such coils is the finite number of available simultaneous data acquisition channels in the host MR system; frequently, there are only four available channels, sometimes known as receivers, in the host system.

Another issue is the reconstruction time to create the images from the collected data; processing multiple channels to form a single image increases the time needed by the magnetic resonance imaging system to process the data, by two or three dimensional Fourier Transform techniques or other methods, to create the final images. Another consideration is the fact that data acquisition hardware with additional performance capabilities may only be available on one receiver, or on fewer than the total number of available receivers.

SUMMARY OF THE INVENTION

Reconstruction of an image from two quadrature modes of a specific phased array coil element via two separate data acquisition channels [or receivers] provides the best possible image signal to noise ratio and uniformity, since the data can always be reconstructed in the most optimum way. However, the use of two separate receivers for the two quadrature signals from a specific phased array coil element may cause problems with reconstruction time, or limitations due to the finite number of available receivers. Thus, there may be conditions when combining the two quadrature signals at the RF level into a single signal may be most advantageous, and other times when processing the two RF signals independently via two separate data acquisition receivers may be the best scheme.

The present invention allows the two quadrature signals to be acquired as a single signal, precombined at the RF level within the coil interface, or as two separate RF signals by two of the receivers of the phased array hardware. It also provides a means for remote selection of the mode of operation from the operator's console when the system is used with a MRI system, such as the GEMS Signa system.

BRIEF DESCRIPTION OF THE DRAWINGS

The preferred embodiments of the present invention are illustrated by way of example, and not limitation, in the figures of the accompanying drawings, in which:

FIG. 1 is wire model of a phased array neurovascular coil;

DETAILED DESCRIPTION OF THE PRESENTLY PREFERRED EMBODIMENT(S) OF THE INVENTION

Figure 2A:
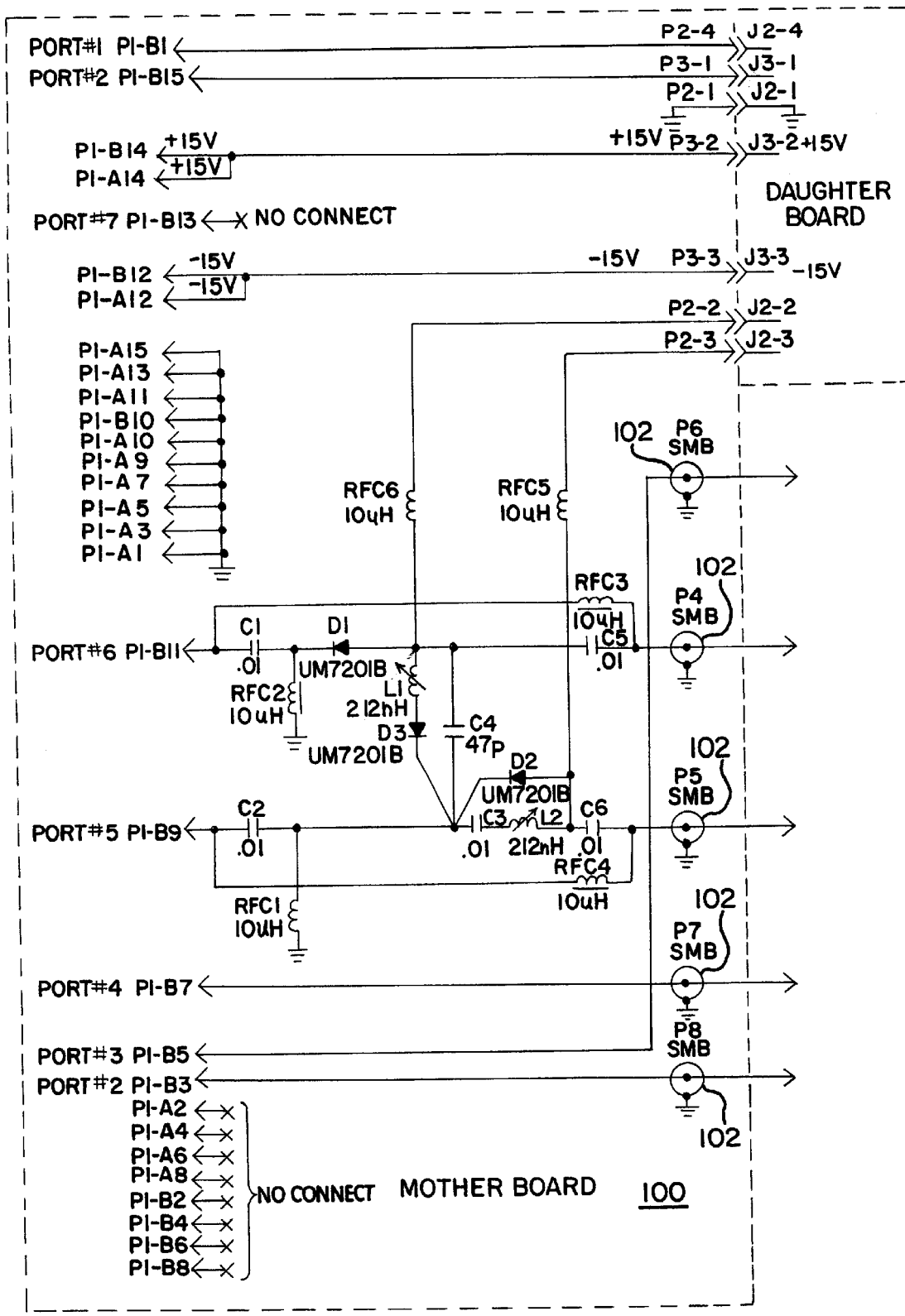
FIGS. 2A and 2B are electrical schematics of a coil interface circuit that provides multimode operation of the phased array neurovascular coil shown in FIG. 1.

The presently preferred embodiments of the invention will now be described with reference to the Figures, in which like elements are referred to by like numerals. A number of specific applications of a preferred embodiment are discussed. In particular, the multimode operation of a neurovascular coil designed for and operating on the General Electric Medical Systems Signa MRI system is described; however, the preferred embodiments may be applied to other coils and other systems by those skilled in the art after reviewing this detailed description.

FIG. 1 is wire model of a phased array neurovascular coil 50, also referred to herein as a neurovascular array coil. The neurovascular array coil 50 contains four separate imaging coils. The first coil is a quadrature tapered birdcage 60 covering the brain and head. Further details regarding the quadrature tapered birdcage are provided in U.S. application Ser. No. 09/449256, ref. filed Nov. 24, 1999, the contents of which are incorporated herein by reference. The first coil may alternatively be in the form of a domed birdcage, such as is described in U.S. Pat. No. 5,602,479, the contents of which are incorporated herein by reference, although the tapered birdcage is preferred because it provides improved field homogeneity on the XZ and YZ image planes.

The second coil is formed from two posterior cervical spine coils 70, the outputs of which are preferably combined at the RF level. The third and fourth coils are a superior anterior neck coil 80 and an inferior anterior neck coil 90. In accordance with an alternative embodiment, the outputs of the two posterior cervical spine coils 70 are not combined at the RF level and a single anterior neck coil (not shown) replaces the neck coils 80 and 90.

In accordance with a preferred embodiment, the superior anterior neck coil 80 and the inferior anterior neck coil 90 are mounted in an adjustable manner. For example, referring to FIG. 1, the neck coils 80 and 90 may be housed in a support structure 85, as is known to those skilled in the art. In a preferred embodiment, the support structure 85 is mounted in a hinged manner, with the hinge location being toward the superior end of the support structure 85. When mounted in this manner, the inferior end of the support structure 85 may be raised and/or lowered, depending upon the size of the test subject, and may rest on the chest area of the test subject. This provides the advantage of locating the neck coils 80 and 90 as close to the test subject as possible, thereby improving image quality over embodiments in which the neck coils 80 and 90 are fixedly located.

Figure 2B:
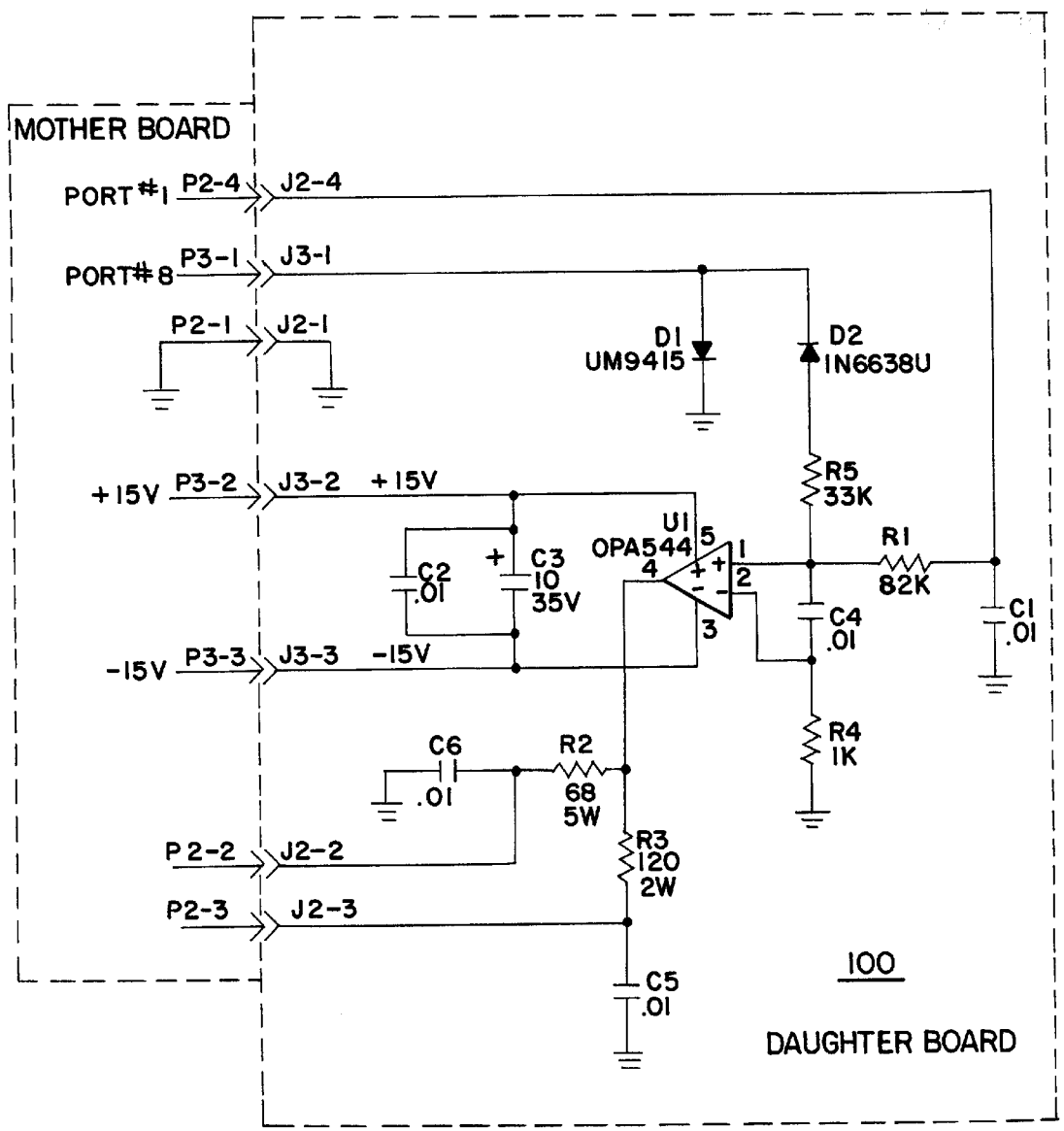

FIGS. 2A and 2B are electrical schematics of a coil interface circuit 100 that provides multimode operation of the phased array neurovascular coil 50 shown in FIG. 1. The coil interface circuit 100 couples the phased array neurovascular coil 50 to a magnetic resonance imaging system. The coil interface circuit 100 has a number of signal input points 102, which are coupled to receive MR signals from the phased array neurovascular coil 50. As shown in FIG. 2A, signal inputs 102 are coupled to output ports, port #2, port #3, port #4, port #5, and port #6, which are in turn coupled to predetermined MRI system receivers. Many systems, including the GEMS Signa system, provide only four receiver channels. Thus, because all the signal inputs 102 cannot simultaneously be applied to the MRI system receivers when the number of potential signal inputs 102 exceeds the number of receivers, the interface circuit 100 allows selected signal inputs 102 to be coupled to the MRI system receivers.

Selection of the operational modes of the phased array neurovascular coil 50 is made in the coil interface 100 unit by the use of PIN diode RF switches, as further described below. The following table defines the relationship between signal inputs 102 to the coil interface 100 and outputs, e.g. port #2–6, from the coil interface 100.

| Signal | SMB | System Port | System Receiver |
|---|---|---|---|
| Head I | P4 | 5 | 0 |
| Head Q (high res) | P5 | 6 | 1 |
| Head Q (high speed) | P5 | 5 | 0 |
| Cspine | P7 | 4 | 3 |
| ANT SUP | P6 | 3 | 2 |
| ANT INF | P8 | 2 | 1 |

In the table above, Head I refers to the in-phase MR signal from the birdcage coil 60, Head Q refers to the quadrature MR signal from the birdcage coil 60, Cspine refers to the combined MR signals from the posterior cervical spine coils 70, ANT SUP refers to the MR signal from the superior anterior neck coil 80, and ANT INF refers to the MR signal from the inferior anterior neck coil 90.

As shown in FIG. 2A, the coil interface 100 is coupled to DC power supplies, +15V and −15V, from the MRI system. The electrical schematic of FIG. 2A also includes a number of inductors, labeled as "RFC"s, that function as RF chokes. The RF chokes are preferably self-resonant at approximately 63.87 MHz. For example, the RF chokes may be obtained from J. W. Miller, part no. RFC-50.

The birdcage coil 60 and the coil interface 100 are designed so that the two quadrature signal components from this coil element may selectively be combined into a single signal for simultaneous use with the other three coil elements. This provides coverage of the entire volume within the quadrature neurovascular array 50 using a total of four simultaneous data acquisition channels [receivers] from the MRI system. In addition, by combining the two quadrature signal components, a preferred embodiment allows for applications employing a single FAST receiver, where only one of the available phased array receivers has the FAST data acquisition capability.

When the brain or the brain, brain stem, and cervical region of the spinal cord, for example, are to be imaged with the highest possible image signal to noise ratio and uniformity, another mode may be used. Specifically, the coil interface 100 directs the two quadrature components of the MR signal from the tapered birdcage coil element 60 into two separate receivers for optimum results. An advantage of this feature is that it preserves the ability to simultaneously cover the entire region from the aortic arch to the top of the head in one phased array acquisition, enables the use of one high performance receiver channel for complete acquisition of images from the brain, and yet enables the highest degrees of resolution, signal to noise ratio, and uniformity to be obtained from the brain, and associated neurological areas of interest by acquiring the data from the two quadrature modes of the tapered birdcage coil element through two separate receivers.

The coil interface 100 supports distinct imaging functions by automatic selection of the optimum assembly of the array coil elements. As described below, the coil interface 100 may be remotely configured, i.e. the state of one or more PIN diode RF switches may be set, based upon inputs from the MRI system console. Examples of distinct imaging modes that may be supported a coil interface, such as the coil interface shown in FIGS. 2A and 2B, include: NEUROVASCULAR, HIGH RESOLUTION BRAIN, HIGH SPEED BRAIN, HIGH RESOLUTION BRAIN AND CERVICAL SPINE, CERVICAL SPINE, and VOLUME NECK.

Each of these modes is preferably activated by selecting the appropriate Coil Name from the coil selections on the console of the host MRI system when prescribing the scan. By way of the coil interface 100, the needed coils and the signal combining method are activated for the selected mode, and the unused coil elements are electronically disabled to optimize image quality and minimize artifacts. Each mode has a distinct method of operation as described below.

Neurovascular Mode

In NEUROVASCULAR mode, all of the coil elements in the phased array neurovascular coil 50 are active, and the birdcage coil 60 operates in quadrature with the two signals combined to drive a single receiver. Specifically, the coil interface 100 includes a combiner circuit, including a switch and a phase shifter, that is set to combine the in-phase, or "I," output and the quadrature, or "Q," output of the birdcage coil 60 before applying the signal to the MRI system preamplifier at port #5. The two posterior spine coils 70 drive a single receiver, such as port #4. The superior anterior neck coil 80 and the inferior anterior neck coil 90 each drive a separate receiver, such as ports #3 and #2, respectively. Thus, in NEUROVASCULAR mode, the coil interface 100 provides a total of four simultaneous data acquisitions, the maximum number of simultaneous data acquisitions that can be handled by the MRI system. Since the coverage volume is large, the signal to noise ratio performance of the head portion of the coverage may be slightly reduced, by the combination of the I and Q outputs of the birdcage coil 60, to allow only one receiver channel to be used to cover the head region.

Figure 3:
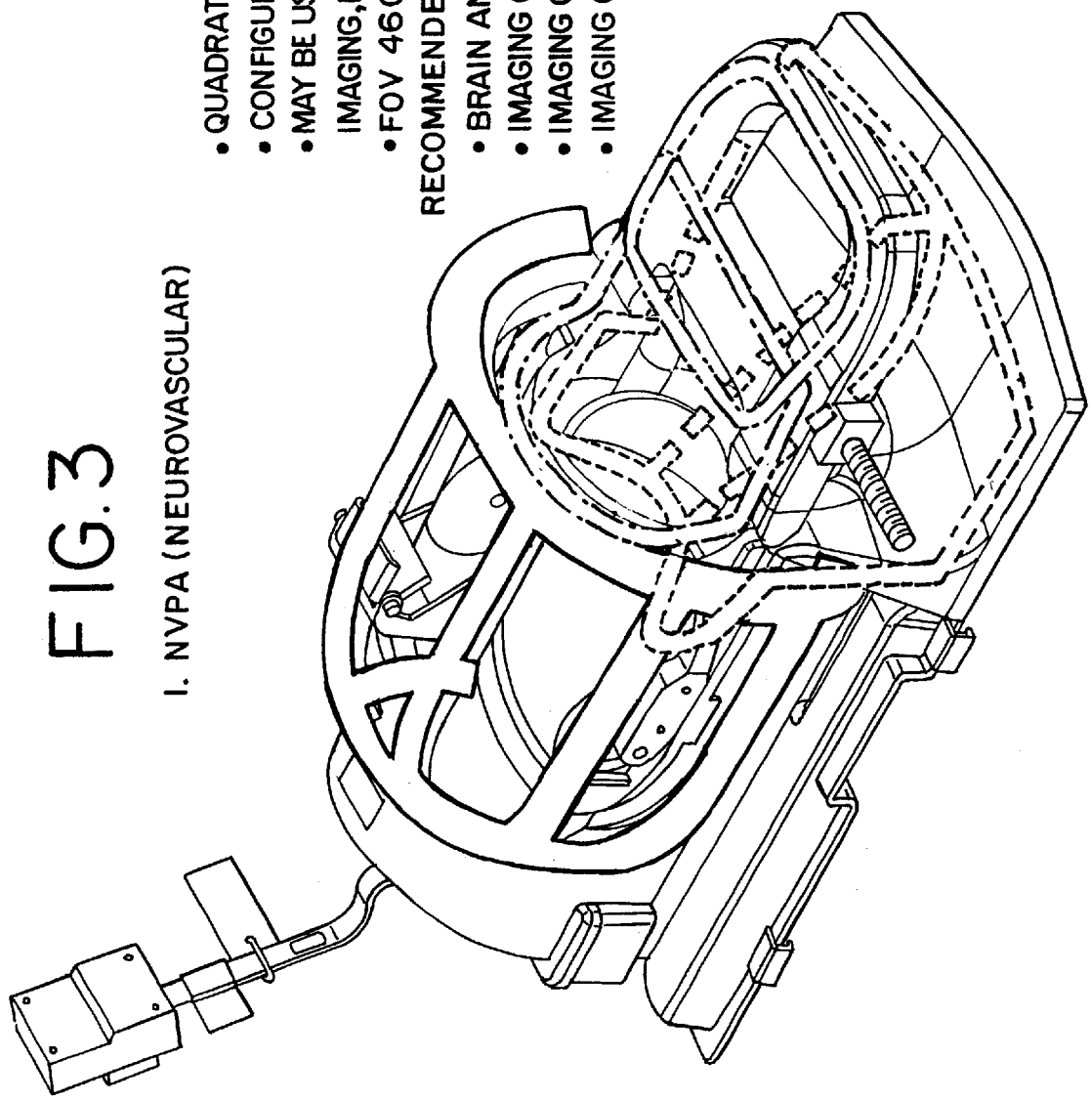
FIG. 3 is a wire model of the phased array neurovascular coil in a first operational mode.

FIG. 3 is a wire model of the phased array neurovascular coil 50 in NEUROVASCULAR mode. As noted above and shown in FIG. 3, all elements of the phased array neurovascular coil 50 are activated and the MRI system operates in the phased array mode. The NEUROVASCULAR mode may be used for all types of brain and neck imaging, other than Echo Planar Imaging. The NEUROVASCULAR mode is particularly useful for brain and/or cervical spine localizers, imaging of the cervical spine, imaging of the carotid arteries, and imaging of the aortic arch. The preferred embodiment shown in FIG. 3 advantageously provides a field of view of up to 46 cm.

High Resolution Brain Mode

In HIGH RESOLUTION BRAIN mode, the two quadrature components of the MR signal from the birdcage coil 60 each drive a separate receiver channel on the MRI system, providing optimum uniformity and signal to noise ratio performance. Specifically, the coil interface 100 couples the I and Q signals from the birdcage coil 60 to separate receiver ports on the MRI system, such as ports 5 and 6, as shown in FIG. 2A and the table above. The combiner circuit in the coil interface 100 is electrically disconnected to allow independent reconstruction of the data from the two channels. The posterior cervical spine coils 70 and the anterior neck coils 80 and 90 are electrically disabled to minimize artifacts and undesirable coil interactions. Since the highest possible degree of signal to noise ratio and uniformity are desired, but coverage of the entire volume of the coil is not needed, two separate receivers are used for the birdcage coil 60 MR signal. Techniques for electrically disabling an imaging coil are well known to those skilled in the art.

Figure 4:
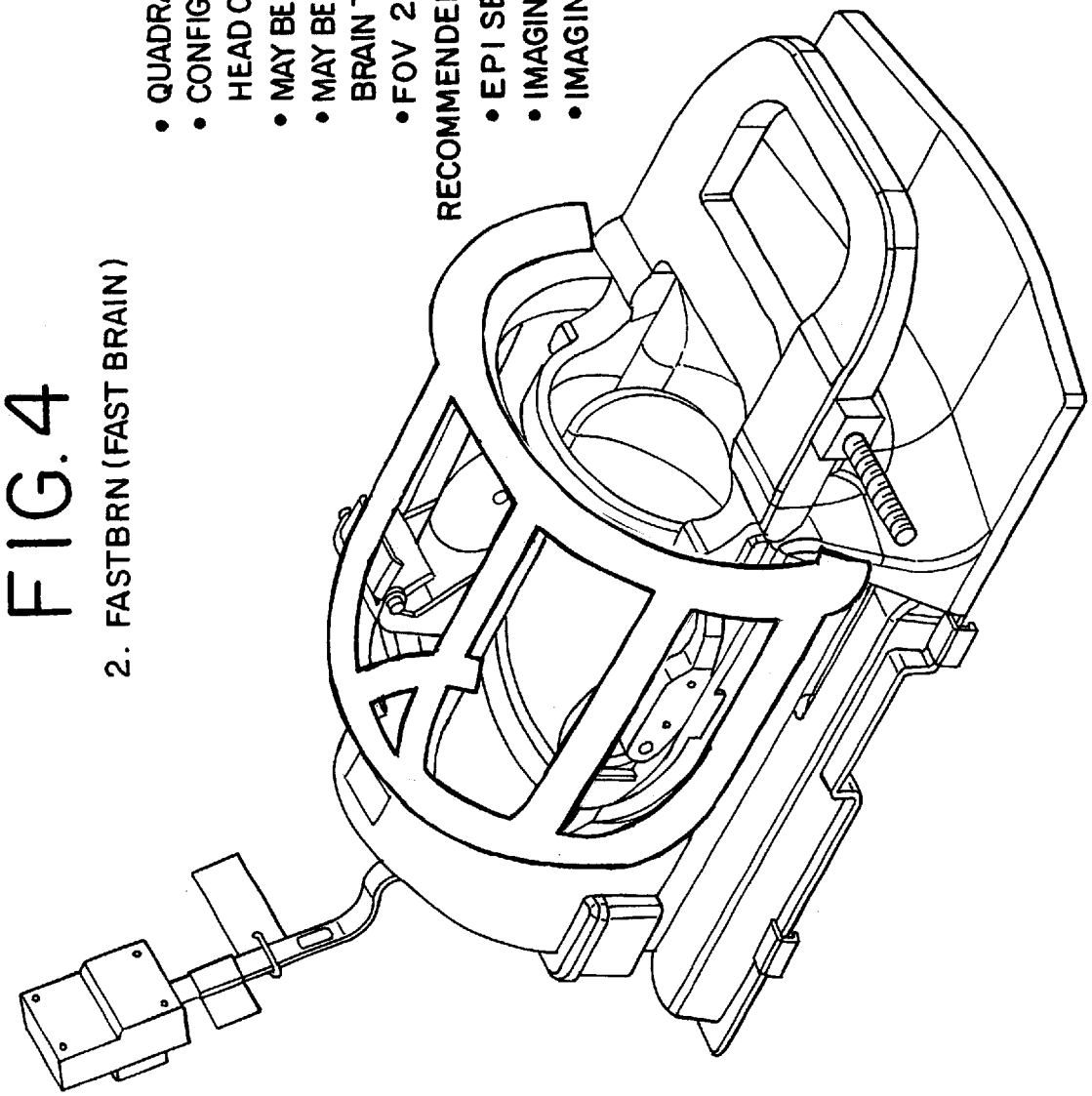
FIG. 4 is a wire model of the phased array neurovascular coil in a second operational mode.

FIG. 4 is a wire model of the phased array neurovascular coil in HIGH RESOLUTION BRAIN imaging mode. As shown in FIG. 4, only the quadrature birdcage coil 60 is activated; the cervical spine coils 70 and the anterior neck coils 80 and 90 are electrically disabled. The MRI system operates in phased array mode. The HIGH RESOLUTION BRAIN imaging mode may be used for all types of brain and/or head imaging, other than echo planar imaging, but is especially useful for high resolution studies of the brain. The HIGH RESOLUTION BRAIN imaging mode is also useful for high resolution Circle of Willis imaging. The preferred embodiment shown in FIG. 4 provides a field of view of up to 24 cm.

High Speed Brain Mode

The HIGH SPEED BRAIN mode routes the two quadrature modes of the head birdcage resonator 60 through the combiner circuit in the coil interface 100 to produce one signal containing the signal from both quadrature modes. In FIG. 2A, the combined signal is provided to the MRI system at port #5. The combined signal drives one channel of the phased array system [preferably Receiver 0 (Receiver selection 1 on LX systems) for the GEMS Signa system] to minimize reconstruction time or to allow the use of a single FAST receiver. All other coil elements are electrically disabled.

Figure 5:
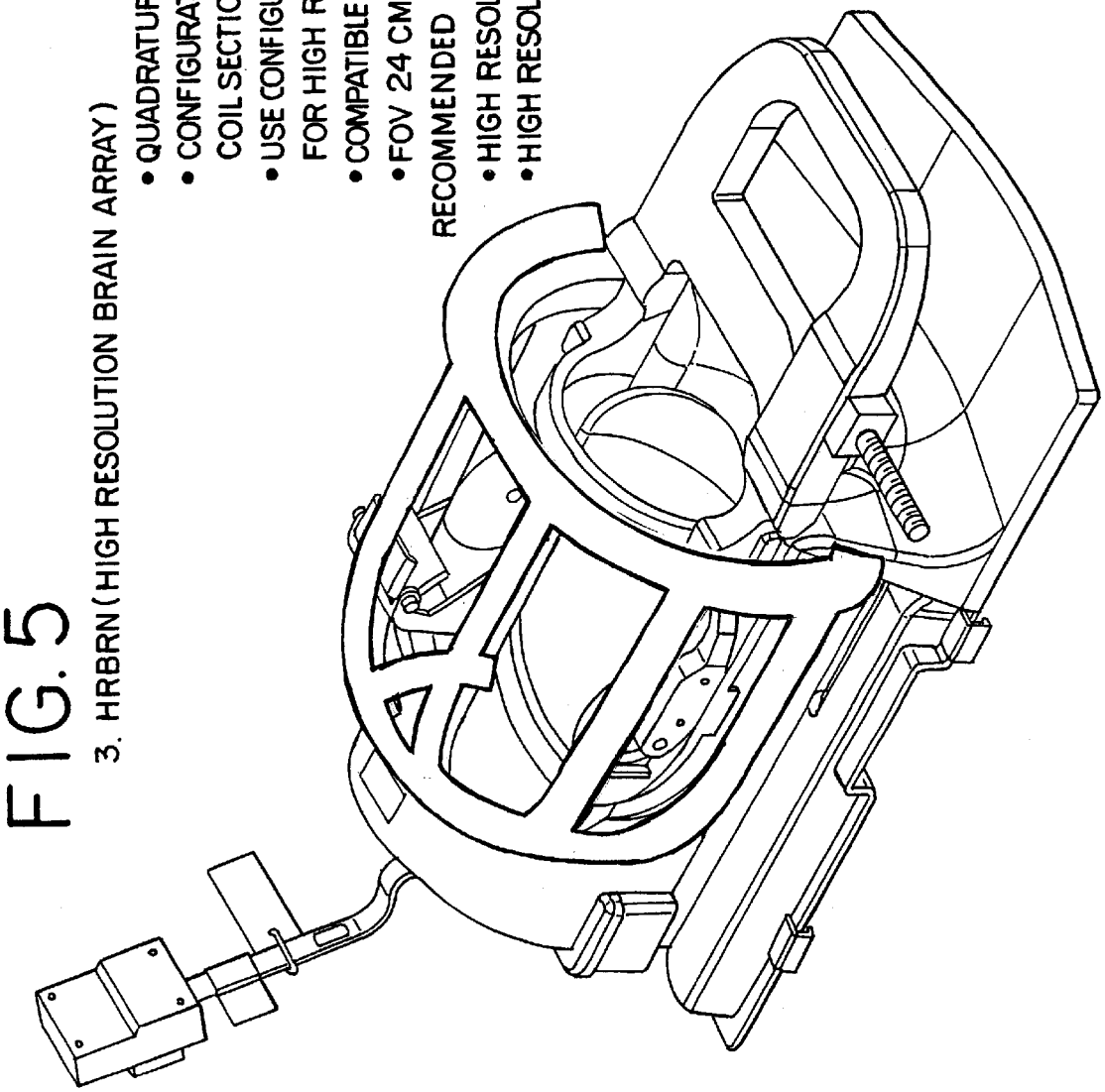
FIG. 5 is a wire model of the phased array neurovascular coil in a third operational mode.

FIG. 5 is a wire model of the phased array neurovascular coil 50 in HIGH SPEED BRAIN mode. Like FIG. 4, only the quadrature birdcage coil 60 is activated; the cervical spine coils 70 and the anterior neck coils 80 and 90 are electrically disabled. The HIGH SPEED BRAIN mode may be used for Echo Planar Imaging and/or vascular or other studies of the brain where decreased acquisition time is desirable. HIGH SPEED BRAIN mode is also useful for imaging the Circle of Willis.

Additional modes of operation for the phased array neurovascular coil 50 may be used by providing the MRI system with the appropriate port masks for the coil interface 100. For example, embodiments of the phased array neurovascular coil 50 may also acquire images from one or more of the following operational modes: HIGH RESOLUTION BRAIN AND CERVICAL SPINE, CERVICAL SPINE and VOLUME NECK. Each of these modes is described in further detail below. For these alternative embodiments, unless otherwise noted, it is assumed that the cervical spine coils 70 are applied separately to the coil interface, rather than being combined at the RF level, and the anterior neck coils 80 and 90 are either combined to provide a single input to the coil interface or replaced by a single anterior neck coil.

High Resolution Brain and Cervical Spine Mode

This mode activates the head and posterior cervical spine coils, and disables the anterior neck coil. This allows focal studies of the brain, brain stem, spinal cord, and cervical spine. The two quadrature components of the MR signal from the birdcage coil 60 each drive a separate receiver channel for optimum uniformity and signal to noise ratio performance. The combiner circuit is electrically disconnected to allow independent reconstruction of the data from the two channels. The two posterior cervical spine coils 70 also each drive a separate receiver channel.

Cervical Spine Mode

In CERVICAL SPINE mode, the two quadrature components of the MR signal from each of the two posterior cervical spine coil elements 70 each drive a separate receiver channel for optimum uniformity and signal to noise ratio performance. The head coil element 60 and the anterior neck coil 80, 90 are electrically disabled to minimize artifacts and undesirable coil interactions.

Volume Neck Mode

This mode disables the tapered birdcage coil covering the head region, and activates the three spine region coils to form a volume acquisition of the neck region. The two quadrature components of the MR signal from each of the two posterior cervical spine coil elements 70 and the anterior neck coil 80, 90 each drive a separate receiver channel for optimum uniformity and signal to noise ratio performance. In one embodiment, the MR signals from the two posterior cervical spine coils 70 are combined at the RF level and applied as a single input to the coil interface 100, along with the two MR signals from the anterior neck coils 80 and 90. For embodiments in which the anterior neck coils 80 and 90 are combined at the RF level, the cervical spine coils 70 are combined at the RF level, or only a single anterior neck coil is used, the acquisition uses an unoccupied channel for the fourth channel [GEMS Signa does not directly support a three coil acquisition; Phased Array Data sets must be from one, two, or four receivers].

As noted above, selection of the modes is made in the coil interface 100 unit by the use of PIN diode RF switches; the switches either direct the two quadrature signals from the two modes of the birdcage coil element 60 to two separate MR receivers, or combine them with a relative phase difference of 90° and direct them to a single receiver. Determination of which mode to support is made via detection of the bias pattern of the ports in the host GEMS Signa MRI system. As will be apparent to those skilled in the art, the electrical length of the path of the various MR signals through the coil interface 100 should be compensated to ensure that the MR signals may be properly combined by the MRI system. For example, the electrical lengths of the paths through the coil interface 100 may be adjusted to be an integer multiple of half wavelengths.

In view of the wide variety of embodiments to which the principles of the present invention can be applied, it should be understood that the illustrated embodiments are exemplary only, and should not be taken as limiting the scope of the present invention. For example, the steps of the design method may be taken in sequences other than those described, and more or fewer elements may be used than are described. In addition, although reference is made herein to the GEMS Signa MRI system, other systems having similar capabilities may alternatively be used to receive and process signals from the coils described above.

I claim:

1. A coil interface for coupling a plurality of coil elements in a phased array magnetic resonance imaging coil to a host magnetic resonance imaging system, comprising:

a plurality of signal inputs for coupling to the plurality of coil elements;

a plurality of output ports for coupling to predetermined receivers of the host magnetic resonance imagining system; and a interface circuit that in a first imaging mode selectively couples at least two signal inputs to an equal number of output ports, and, in a second imaging mode, selectively couples at least two signal inputs to a lesser number of output ports.

2. A coil interface as claimed in claim 1, wherein the interface circuit is remotely configured to couple said plurality of signal inputs to a predetermined sequence of output ports.

3. A coil interface as claimed in claim 1, wherein said plurality of signal inputs comprises an in-phase MR signal and a quadrature MR signal from a quadrature birdcage coil.

4. A coil interface as claimed in claim 3, wherein said interface circuit is remotely configured to couple said in-phase MR signal input and said quadrature MR signal input to a single predetermined output port.

5. A coil interface as claimed in claim 3, wherein said interface circuit is remotely configured to couple said in-phase MR signal input to a first predetermined output port and to couple said quadrature MR signal input to a second predetermined output port.

6. A coil interface as claimed in claim 1, wherein said plurality of signal inputs exceeds said plurality of output ports in number.

7. A coil interface as claimed in claim 1, wherein a conductive path through said interface circuit between an input from the plurality of signal inputs and an output port from the plurality of output ports has an electrical length that is equal to an integer multiple of half wavelengths.

8. A coil interface as claimed in claim 1, wherein said interface circuit comprises a remotely operable PIN diode switch and a 90° phase shift.

9. A coil interface as claimed in claim 8, wherein PIN diode switch is operable from an operator's console for the magnetic resonance imaging system.

10. A coil interface as claimed in claim 1, wherein a first signal input comprises an in-phase magnetic resonance signal from a quadrature coil element within said plurality of coil elements and a second signal input comprises a quadrature magnetic resonance signal from the quadrature coil element.

11. A coil interface as claimed in claim 10, wherein said first signal input is coupled to a first output port and said second signal input is coupled to a second output port, in accordance with the first mode of operation.

12. A coil interface as claimed in claim 10, wherein only one of said first signal input and said second signal input is applied to a phase shifter, producing a phase shifted signal input and a remaining signal input.

13. A coil interface as claimed in claim 12, wherein said phase shifted signal input and said remaining signal input are combined and then applied to a single output port, in accordance with the second mode of operation.

14. A method of operating a quadrature phased array MR coil in a plurality of imaging modes, comprising:

providing an interface circuit that selectively couples a plurality of elements of the quadrature phased array MR coil to a host MRI system, wherein the plurality of elements comprises at least one quadrature element, the at least one quadrature element generating an in-phase MR signal output that is coupled to the interface circuit and a quadrature MR signal output that is coupled to the interface circuit;

selecting a first imaging mode from the plurality of imaging modes; and responsively configuring the interface circuit to couple the in-phase MR signal output to a first receiver in the host MRI system and to couple the quadrature MR signal output to a second receiver in the host MRI system.

15. A method as claimed in claim 14, further comprising the step of disabling unused coil elements in the quadrature phased array MR coil in accordance with the selection of the imaging mode.

16. A method as claimed in claim 14, wherein the step of configuring the interface circuit comprises adjusting a state of a radio frequency switch.

17. A method as claimed in claim 16, the state of the radio frequency switch causes an in-phase MR signal output from a quadrature element of the quadrature phased array MR coil to be routed to a first receiver input, and causes a quadrature MR signal output from the quadrature element to be routed to a second receiver input.

18. A method as claimed in claim 16, wherein the state of the radio frequency switch causes an in-phase MR signal output from a quadrature element of the quadrature phased array MR coil to be combined with a quadrature MR signal output from the quadrature element forming a combined MR signal, the combined MR signal being coupled by the interface circuit to a single receiver input.

19. A method as claimed in claim 18, wherein said single receiver input comprises a FAST receiver input.

* * * * *